United States Patent [19]
Chen

[11] Patent Number: 5,504,793
[45] Date of Patent: Apr. 2, 1996

[54] MAGNIFICATION CORRECTION FOR 1-X PROXIMITY X-RAY LITHOGRAPHY

[75] Inventor: Alek C. Chen, Mount Kisco, N.Y.

[73] Assignee: Loral Federal Systems Company, McLean, Va.

[21] Appl. No.: 389,993

[22] Filed: Feb. 17, 1995

[51] Int. Cl.[6] ................................................ G21K 5/00
[52] U.S. Cl. ................................................ 378/34; 378/35
[58] Field of Search ........................... 378/34, 35, 208; 250/492.1

[56] References Cited

U.S. PATENT DOCUMENTS

| | | | |
|---|---|---|---|
| 4,592,081 | 5/1986 | Eaton et al. | 378/34 |
| 4,887,282 | 12/1989 | Mueller | 378/34 |
| 4,964,145 | 10/1990 | Maldonado | 378/35 |
| 5,155,749 | 10/1992 | DiMillia et al. | 378/35 |
| 5,308,991 | 5/1994 | Kaplan | 378/35 |

OTHER PUBLICATIONS

IBM Technical Disclosure Bulletin, vol. 33, No. 1A, Jun. 1990, Keyser et al., "Correcting Pattern Distortions in Membrane Masks".

IBM Technical Disclosure Bulletin, vol. 33, No. 3A, Aug. 1990, Maldonado et al. "Magnification Correction for X-Ray Mask Substrates".

IBM Technical Disclosure Bulletin, vol. 36, No. 10, Oct. 1993, Guhman et al. "Method for Correcting Elastic Distortions in Membrane Masks".

Primary Examiner—David P. Porta
Assistant Examiner—Don Wong
Attorney, Agent, or Firm—Lane, Aitken & McCann

[57] ABSTRACT

In 1-X proximity X-ray lithography involving an X-ray mask having a ring, a rectangular membrane formed in a mask element, and a design pattern defined on the membrane, mechanical devices are provided to produce torque in the ring and, thereby, stretch or shrink the membrane and the design pattern. The mechanical devices are arranged on axes intersecting one another and extending diagonally through the corners of the membrane, as well as on axes which bisect angles formed by the intersection of the corner axes.

25 Claims, 6 Drawing Sheets

MAX VECTOR = 157 nm

SIGMA x = 66 nm

SIGMA y = 66 nm

KEY 100 nm

MAX VECTOR = 5 nm

SIGMA x = 0.4 nm
SIGMA y = 0.4 nm

→
KEY 10 nm

MAX VECTOR 245 nm

SIGMA x = 107 nm
SIGMA y = 107 nm

→
KEY 100 nm

MAGNIFICATION CORRECTION FOR 1-X PROXIMITY X-RAY LITHOGRAPHY

The U.S. Government has certain rights in this invention under the terms of contract number N00019-91-C-0207 awarded by the Department of the Navy.

BACKGROUND OF THE INVENTION

Lithography is a critical step in the manufacturing of electronic integrated circuits. In the lithographic step, circuit design patterns first created on a mask are imaged on a silicon wafer using lithographic exposure tools (like everyday cameras), commonly known as optical exposure steppers. A circuit design pattern of a mask is imaged serially in a stepwise fashion on a plurality of locations in a regular array on the silicon wafer. Integrated circuits are manufactured by overlaying several circuit design patterns onto the silicon wafer locations using the exposure tools. As future integrated circuits require ever decreasing line widths, 1-X proximity X-ray lithography, a type of lithography in which the pattern on the mask is the same size as the image on the silicon wafer, becomes an increasingly important method to produce these circuits, because it uses electromagnetic radiation sources with much smaller wavelengths.

One main function of the lithography process, besides imaging the circuit pattern, is to align a subsequent circuit design pattern with previous levels of design patterns on the silicon wafer without introducing significant overlay errors. Excessive overlay error can prevent manufactured circuits from functioning. One of the sources of overlay error is a relative magnification mismatch between the mask and the wafer. The magnification mismatch is caused by heat associated with the process, which causes the silicon wafer and, therefore, the circuit patterns already formed in the silicon wafer, to expand by varying amounts at different times. As a result, subsequent mask patterns must be magnified to be the same size as the patterns already formed on the silicon wafer, and thereby minimize overlay error.

Unlike known optical exposure steppers, 1-X proximity X-ray exposure steppers (called X-ray steppers or X-ray aligners) do not have optical reduction lenses. An X-ray mask is held in proximity to the silicon wafer, typically 5 to 50 microns away from the wafer surface. The circuit design pattern on the mask resides on a thin membrane which allows transmission of X rays. Absorbers on some areas of the membrane prevent sufficient X rays striking those areas from reaching the wafer surface, which is coated with a layer of photo-sensitive film. Thus, the circuit pattern is imaged onto the wafer by the X rays passing through areas in the membrane on which there are no absorbers. Since the X-ray stepper does not contain optical lenses to match the pattern on the mask to the patterns on the silicon wafer, any magnification adjustment to minimize the magnification mismatch between the mask and the previous patterns on the wafer is extremely difficult.

Techniques of magnification correction have been proposed previously. U.S. Pat. No. 4,964,145 discloses using a piezoelectric film on the mask to create dimensional changes of the pattern. U.S. Pat. No. 5,155,749 discloses using a thermally controlled metal ring imbedded in an X-ray mask to enlarge or contract the mask pattern. Both of these techniques require additional process steps in the fabrication of the X-ray mask, thereby complicating the mask making procedures. Furthermore, a thermal source close to the exposure area can create other overlay errors, and such errors cannot be corrected.

Magnification without overlay error is complicated by the much greater stiffness of the mask member outside the membrane than in the membrane. This fact and the rectangular shape of the membrane in a circular ring makes pure magnification by the application of mechanical force so difficult. The areas of the mask membrane around the corners of the rectangular membrane produce higher stiffness which causes deformation of the membrane around the corners to be different from deformation of the membrane along its edges, between the corners.

SUMMARY OF THE INVENTION

The current invention uses an arrangement of mechanical actuators to adjust an X-ray mask to create in variable amounts dimensional changes in a mask pattern. As a result, magnification mismatch between the mask pattern and patterns previously formed on a wafer can be minimized or eliminated. Higher-order distortion is less than 3%. The current invention is intended to be implemented on an X-ray stepper rather than in the mask. Therefore, no modification in the mask making procedure is needed.

The mechanical actuators are positioned around the periphery of a ring of the X-ray mask which supports a mask element in which a rectangular membrane is defined. In turn, a circuit pattern or mask pattern is defined on the membrane. The mechanical actuators torque or twist the ring to create the dimensional changes in the mask pattern. The mask element is secured to the ring, and the membrane is in tension as a result of the fabrication process. In a preferred embodiment, the mechanical actuators are situated along four axes extending parallel to the plane of the rectangular membrane, two actuators on each axis. Thus, eight sets of actuators are used to produce nearly pure magnification adjustment of the mask pattern at appropriate load settings. Two of the axes extend diagonally through the corners of the rectangular membrane, and the other two axes bisect the angles formed by the intersection of the two corner axes. The actuators apply loads to the ring along directions that are perpendicular to the plane of the mask element.

To enlarge the mask pattern, or increase the magnification setting of the mask pattern, the actuators along the corner axes push away from the membrane in an axial direction with respect to the ring, whereas the mid-point actuators push axially toward the membrane in appropriate proportion, which depends on the size of the membrane in relation to the diameter of the ring. The various actuators actuate at proper loading conditions to produce a net zero force on the mask. Thus, there is no net force from the actuator loading which would tend to make the mask move. Any such net moving force would require restraint points or supporting elements of the X-ray stepper, which hold the mask, to resist the net moving force. The resistance by the restraint points would impose forces on the ring, thereby distorting the mask pattern in a way which can not be corrected.

The mechanical actuators can be easily designed as a part of the mask mounting mechanism in the X-ray stepper. As a result, no modification of the X-ray mask is required. This avoids all the complication needed in the techniques of U.S. Pat. Nos. 4,964,145 and 5,155,749.

DETAILED DESCRIPTION OF THE PREFERRED EMBODIMENTS

Figure 1:
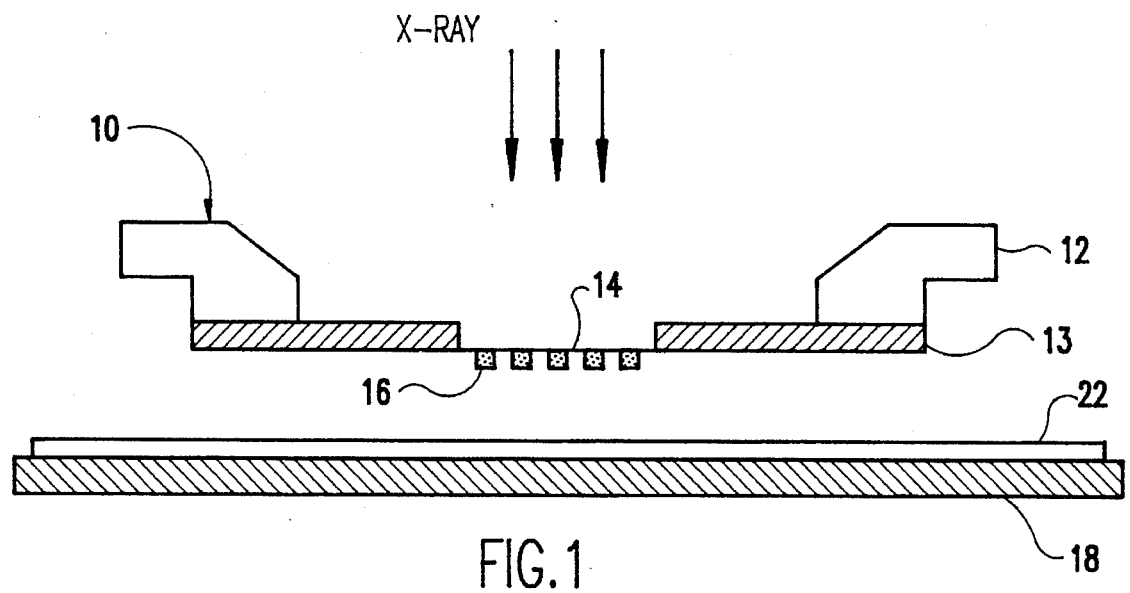
FIG. 1 is a side view of an X-ray mask positioned above a silicon wafer.
Figure 2:
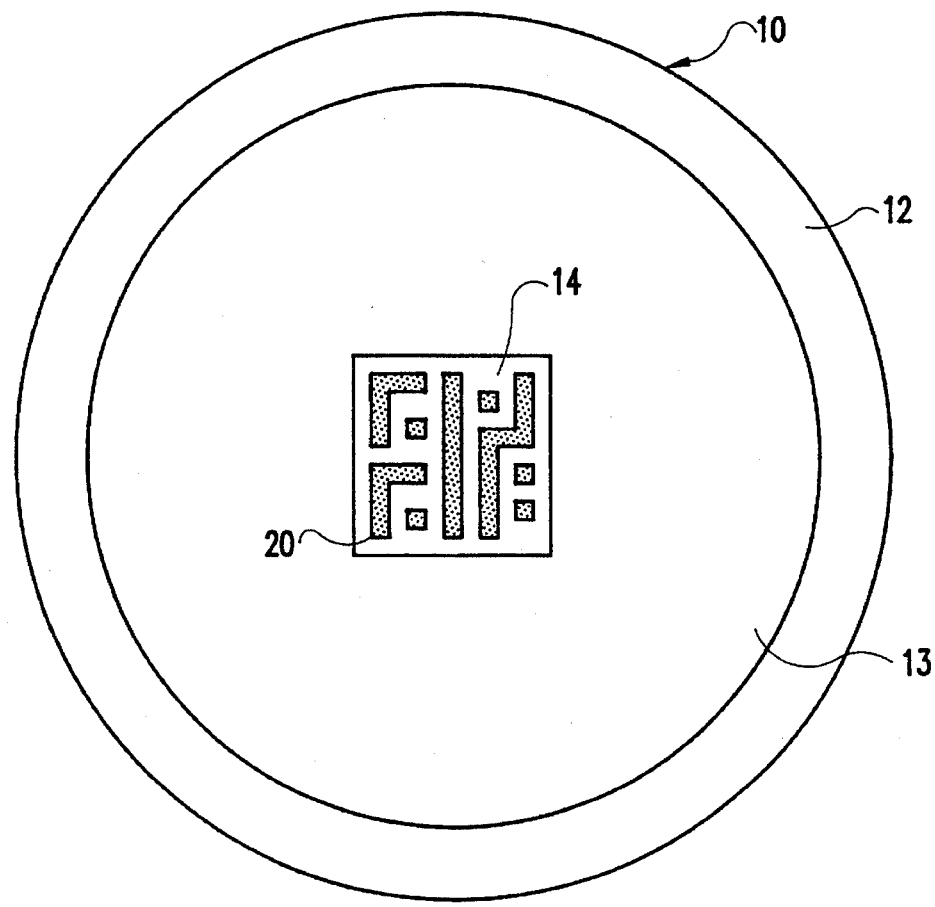
FIG. 2 is a bottom plan view of the X-ray mask of FIG. 1.

As can be seen from FIGS. 1 and 2, an X-ray mask 10 to be used with the present invention includes a ring 12 of, for example, PYREX, a mask element 13 of silicon secured to the ring by, for example, anodic bonding, and a thin rectangular membrane 14 formed in the mask element and defining one piece with the mask element 13. The membrane 14 is maintained under tension, an exposure area is defined on the membrane, and X-ray absorbers 16 are on the membrane in selected areas of an exposure area. The X-ray absorbers are high atomic number metals, such as gold or tungsten.

As can be seen from FIG. 1, in a 1-X proximity X-ray exposure stepper, the X-ray mask is held in proximity to a silicon wafer 18, typically 5 to 50 microns away from the wafer surface, and X-rays are directed onto the mask. A circuit design pattern 20 (FIG. 2) resides on the thin membrane 14, which allows transmission of X rays. The X-ray absorbers 16 prevent sufficient X rays reaching the wafer surface, which is coated with a layer of photo-sensitive film 22. Thus, the circuit design pattern 20 is imaged onto the wafer 18 by the X rays passing through areas in the membrane 14 on which there are no absorbers 16.

Figure 3:
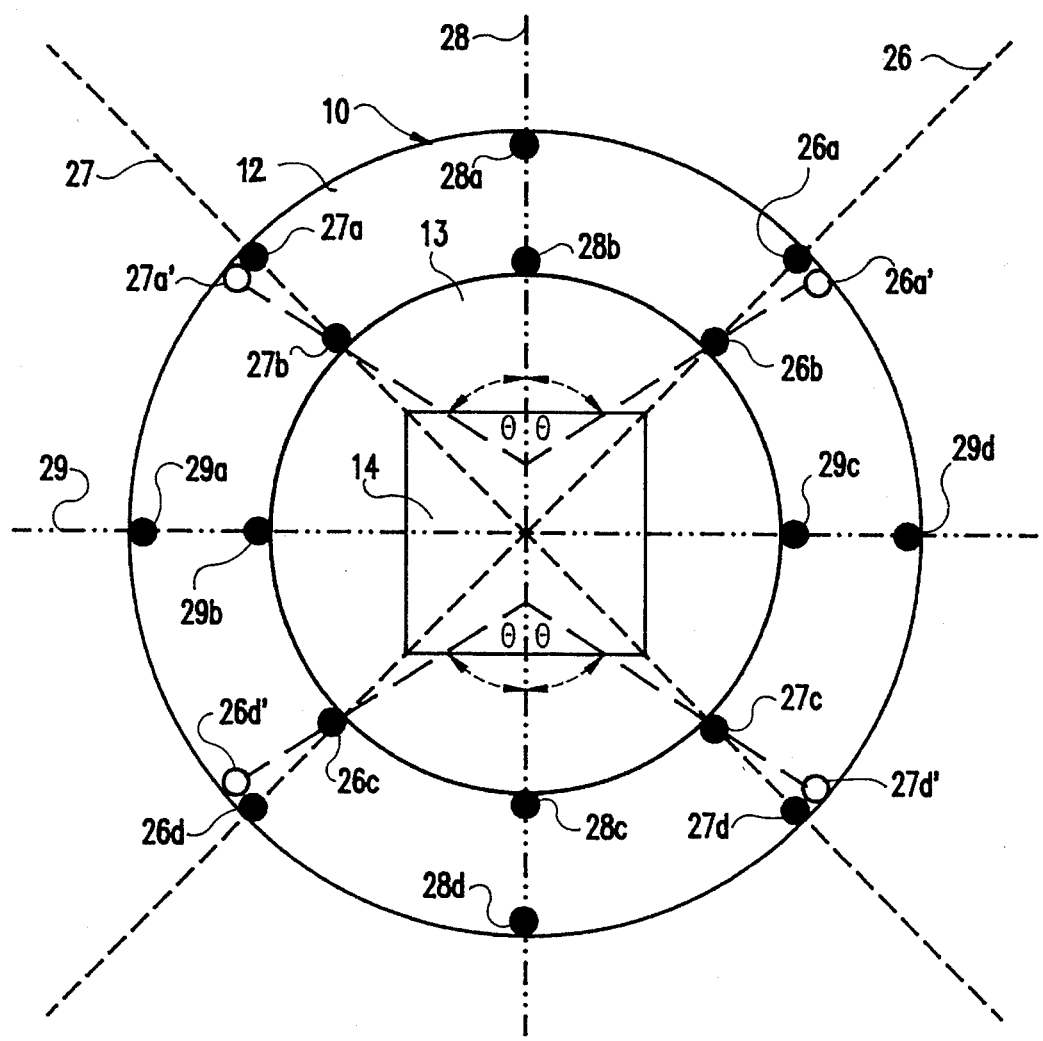
FIG. 3 is a schematic top plan view of a configuration of actuators with respect to the X-ray mask.
Figure 4:
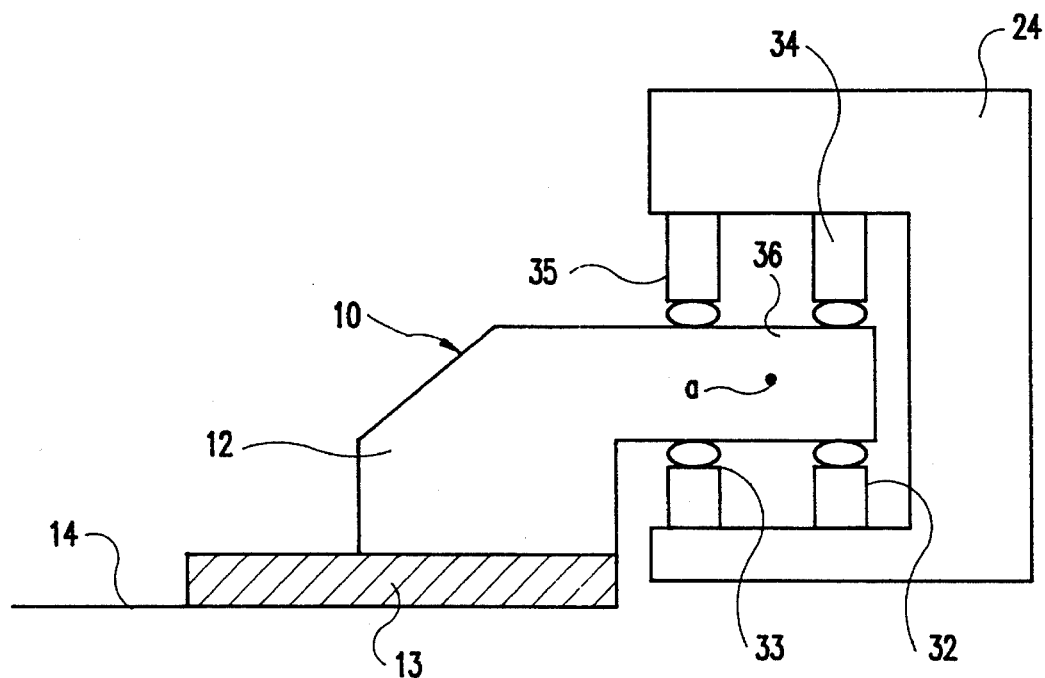
FIG. 4 is an enlarged fragmentary view of a 4-point actuator in position on a portion of the mask of FIG. 1.

As can be appreciated from FIGS. 3 and 4, the present invention uses an arrangement of mechanical actuators 24 to adjust the X-ray mask 10 to create dimensional changes in the mask pattern 20. As a result, the magnification mismatch between the pattern 20 on mask 10 and the patterns already formed on the silicon wafer 18 can be minimized or eliminated.

The mechanical actuators 24 are positioned around the periphery of the ring 12 of the mask 10 along four axes 26, 27, 28, 29 extending parallel to the plane of the mask element 13, with two actuators 24 on each axis. In cases where the membrane 14 is square, the axes are separated from one another by 45 degrees. It is expected that the invention will most often be used where the rectangular membrane is at least substantially square and the axes are separated from one another by substantially 45 degrees. Two of the axes 26, 27 extend diagonally through the corners of the membrane 14, and the other two axes 28, 29 bisect the angles formed by the intersection of the two corner axes 26, 27. The actuators 24 apply loads to the ring 12 of the mask 10 along directions that are normal to the plane of the mask element 13. The loads are applied to the ring 12 at four locations along each axis, two locations on each side of the center of the ring. The loads are applied at locations 26a, 26b, 26c and 26d along axis 26, locations 27a, 27b, 27c and 27d along axis 27, etc. The locations 26a and 26d are radially outward from the locations 26b and 26c, respectively, with respect to the center of the ring 12. The 'a' and 'd' locations are also radially outward from the 'b' and 'c' locations, respectively, on the axes 27, 28 and 29.

Mechanical loading can be applied electrostatically, if the ring 12 is conductive, by mechanical springs, by pneumatic pistons, or by other arrangements. In one embodiment, mechanical actuators each comprising a single forcing element (not shown) are situated at each of the sixteen locations 26a–29d shown in FIG. 3. In another embodiment, as shown in FIG. 4, a single actuator 24 has four forcing elements 32, 33, 34 and 35. The forcing elements 32 and 34 are radially outer, and the forcing elements 33 and 35 are radially inner, both with respect to the ring 12. These forcing elements can be, for example, mechanical springs, linear motors, or pneumatic plungers. The forcing elements can apply forces of varying amounts by, for example, controlling the pressure of compressed air fed to the pneumatic plungers. The control of the compressed air can be performed in connection with a computer is a part of conventional X-ray mask steppers.

To stretch the membrane 14, the outer forcing element 32 pushes away from the mask element 13 while the inner forcing element 35 pushes toward the mask element, producing a counterclockwise twist (or moment) of the mask ring 12, as viewed in FIG. 4, about a torque axis 'a'. As a result, the membrane 14 is enlarged. To shrink the mask membrane 14, the inner forcing element 33 pushes away from the mask element while the outer forcing element 34 pushes toward the mask element, producing clockwise twist (or moment) of the mask ring 12 about a torque axis as viewed in FIG. 4. As a result, the membrane 14 contracts. The mask ring 12 has opposite axial sides, and the torque axes lie between the axial sides. The torque is applied in planes normal to a plane defined by the mask element 13. The membrane 14 is held under tension on the ring 12 in a plane spaced from the torque axes.

To enlarge the mask pattern 20, or increase the magnification setting of the mask pattern, by a variable, desired amount, the mechanical actuators 24 along the corner axes 26 and 27 push away from the mask element 13 in a perpendicular direction with respect to the plane of the mask element, whereas the mid-point actuators, the actuators 24 along the bisecting axes 28 and 29, push axially toward the mask element 13 in appropriate proportion, which depends on the size of the membrane 14 in relation to the diameter of the ring 12. The various actuators 24 actuate at proper loading conditions to produce a net zero force on the mask 10. Thus, there is no net force from the actuator loading which tends to make the mask move. Any such net moving force would require restraint points or supporting elements of the X-ray stepper, with which the present invention is used, to resist the net moving force. The resistance by the restraint points would impose forces on the ring 12, thereby distorting the mask pattern 14 in a way which can not be corrected.

Actuators 24 are placed around the mask ring 12 so that their forcing elements engage the mask ring at the sixteen locations 26a–29d shown in FIG. 3. Thus, for the actuators 24 shown in FIG. 4, eight actuators are employed. The four forcing elements of each actuator 24, such as the forcing elements 32–35, engage the mask ring 12 at two of the locations shown in FIG. 3, two of the forcing elements positioned to apply force to the ring in a first direction perpendicular to the plane of the mask element 13, and the other two forcing elements positioned to apply force to the ring 12 in a second direction opposite to the first direction. In the mask 10 of FIG. 4, the ring 12 has a flange 36, and the forces are applied to opposite sides of the flange. A nearly pure magnification adjustment can be created with an optimized pattern of applied forces on the mask ring 12.

Figure 5:
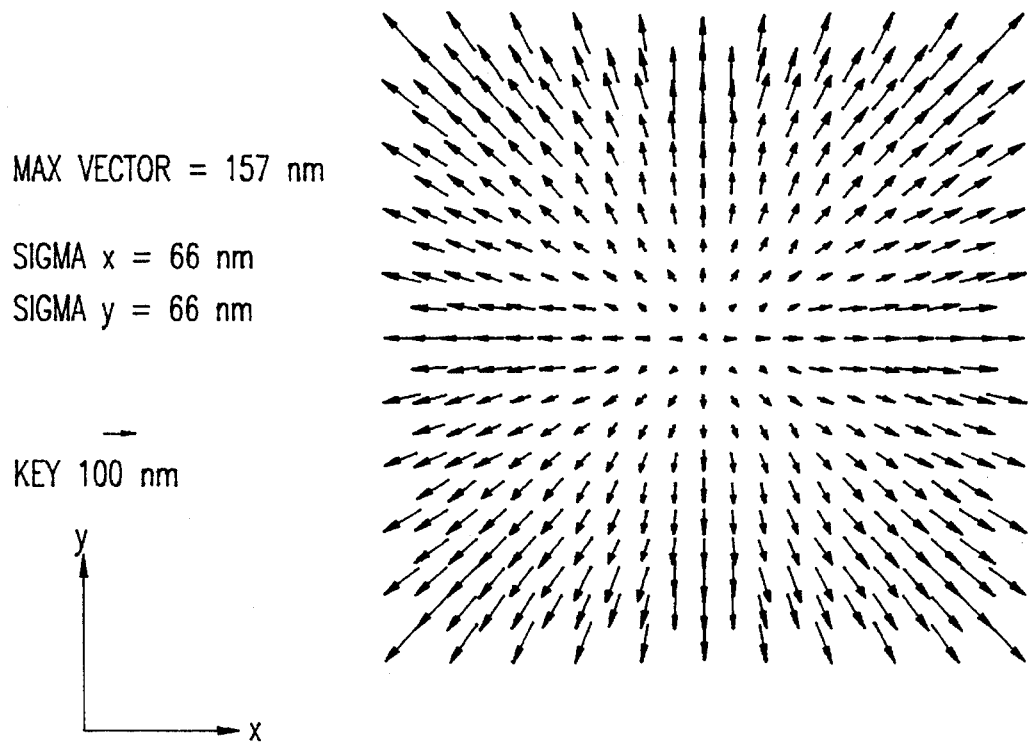
FIG. 5 is a finite element model, using vectors, to indicate the magnification of a mask pattern by employing a first actuator loading configuration according to the present invention.
Figure 6:
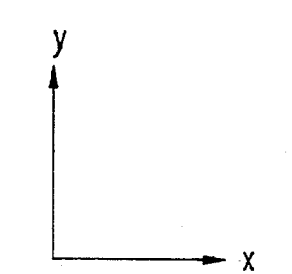
FIG. 6 is a finite element model, using vectors, of the residual error between the mask pattern as magnified in FIG. 5 and a mask pattern which would result in no overlay error.
Figure 6:
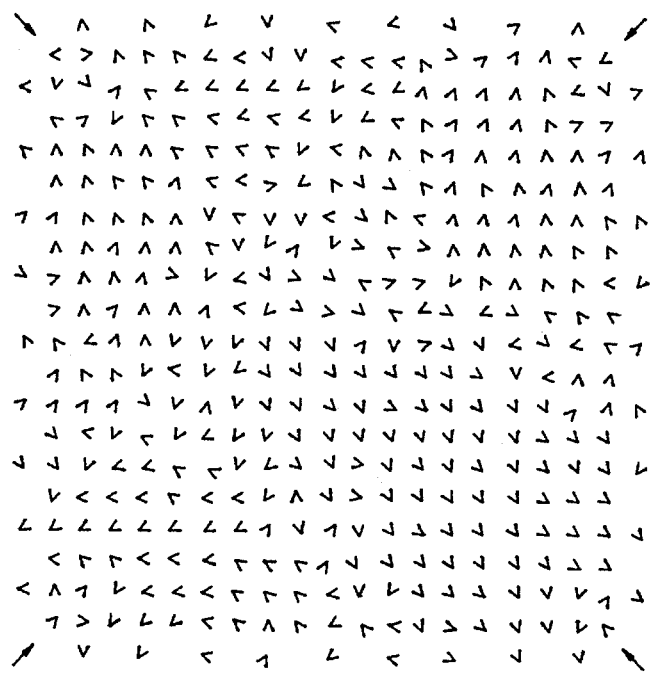

The displacement of the mask membrane 14 as a result of the actuation of the optimized loading pattern is shown in FIG. 5. The displacement is for a square membrane of 50 mm by 50 mm formed in a mask element 13 having a diameter of 100 mm and a thickness of 0.625 mm. The inner diameter of the ring 12 is 82 mm, the outer diameter is 125 mm, and the thickness of the ring is 7 mm. Individual vectors in FIG. 5 indicate the magnitude and direction of movement of various points on the membrane 14 by use of the loading pattern. To indicate the scale, the key in FIG. 5 shows a vector having a magnitude of 100 nm. The resultant mask pattern displacement has a maximum displacement vector of 157 nm and one standard deviation (sigma) both in the x-direction (the horizontal direction in FIG. 5) and in the y-direction (vertical direction) of 66 nm. The maximum displacement vector indicates the direction and greatest amount that any point on the mask pattern 20 is moved as a result of the application of the loading forces. The residual displacement of the mask membrane after a pure magnification displacement of 4.6 parts per million (ppm) is mathematically removed is shown in FIG. 6. The residual displacement has a maximum vector of only 5 nm with one standard deviation, both in the x-direction and in the y-direction, of 0.4 nm. The residual displacement, shown in FIG. 6, represents the unwanted displacement or error as a result of the actuator adjustment made according to the present invention. The residual displacement is the difference between the actual magnification or enlargement of the mask pattern and the magnification or enlargement of the mask pattern which would provide an image on the silicon wafer with no overlay error. The residual displacement is extremely small, as can be appreciated by comparing FIGS. 5 and 6. The large displacement vectors shown in FIG. 6 are along the outer rows and columns, which are at the interface of the membrane 14 and the relatively thick portion of the mask element 13 as shown in FIGS. 1 and 2. Known X-ray mask making processes typically involve creating a mask pattern that is smaller than the size of the membrane. Thus, the maximum residual displacement of actual mask pattern features will be smaller than that shown in FIG. 6. The key in FIG. 6 shows a vector having a magnitude of 10 nm. The results presented in FIGS. 5 and 6 are generated using finite element analysis modelling, a standard mechanical stress and displacement analysis technique.

The optimized loading pattern needed to achieve the magnification adjustment results shown in FIGS. 5 and 6 is now described. To enlarge the mask pattern 14, the radially outer (with respect to the mask ring 12) forcing elements, such as the forcing element 32, lying on the corner axes 26 and 27 on the side of the ring 12 or flange 36 adjacent to the mask element 13 apply primary loads of an identical, reference magnitude at locations 26a, 26d, 27a and 27d in a first direction perpendicular to the plane of the mask element. At the same time, the radially outer forcing elements lying on the bisecting axes 28 and 29 on the side of the ring 12 or flange 36 distal to the mask element 13 each apply 63% of the primary loads at locations 28a, 28d, 29a and 29d in a second direction, perpendicular to the plane of the mask element 13 and opposite to the first direction. Also at the same time, the radially inner forcing elements lying on the corner axes 26 and 27, such as the forcing element 35, on the side of the ring 12 or flange 36 distal to the mask element 13 apply 37% of the primary loads in the second direction at locations 26b, 26c, 27b and 27c. The primary forces applied by some of the forcing elements at 100% in the first direction away from the mask element are exactly balanced by the forces of 63% applied by other forcing elements in the second direction toward the mask element in combination with the forces of 37% applied by still other forcing elements in the second direction. As a result, the net force on the mask is zero. Thus, no reaction forces or minimum reaction forces are generated from the X-ray stepper's mask holding mechanism, which reaction forces would introduce unwanted distortion in the mask 10.

To contract the mask pattern 20, the radially outer forcing elements, such as the forcing element 34 of the actuator 24 of FIG. 4, lying on the corner axes 26 and 27 apply primary loads of identical magnitude at locations 26a, 26d, 27a and 27d in the second direction perpendicular to the plane of the mask element 13. At the same time, the radially outer forcing elements lying on the bisecting axes 28 and 29 apply 63% of the primary loads at locations 28a, 28d, 29a and 29d in the first direction, opposite to the second direction. Also at the same time, radially inner forcing elements lying on the corner axes 26 and 27, such as the forcing element 33, apply 37% of the primary loads in the first direction at locations 26b, 26c, 27b and 27c. The forces applied by elements in the second direction are exactly balanced by the forces applied by other forcing elements in the first direction. As a result, the net force on the mask 10 is zero. Thus, no reaction forces or minimum reaction forces are generated from the X-ray stepper's mask holding mechanism to introduce unwanted distortion on the mask.

The magnitude of the primary or reference force, the force applied at points 26a, 26d, 27a and 27d, is determined in connection with the alignment mechanism on the X-ray stepper, which is described hereinafter. Once the optimum primary or reference force is determined by using the X-ray alignment system of the stepper, the other forces of 63% and 37%, as described above, can be applied by the pertinent forcing elements. All of this can be done automatically in connection with a control computer of the type conventionally associated with a stepper alignment system.

Although specific percentages are given for the forces applied in the example just described, the magnitudes of the relative percentages of the various forces are dependent on the size of the membrane 14 relative to the size of the ring 12. The relative magnitudes are also chosen so that there is a zero net force on the mask 10. It can be appreciated that these principles were used in both the example just described and the example about to be described.

A second loading pattern can be used for applying forces at the locations shown in FIG. 3 to produce a nearly pure magnification adjustment. The second loading pattern is applied to a mask 10 having the same specific dimensions as the mask to which the first loading pattern was applied. For the second loading pattern, the actuators 24 can be divided into two sets: (1) corner actuators, situated along the corner axes 26 and 27, and (2) mid-point actuators, situated along the bisecting axes 28 and 29. To enlarge the mask pattern 20, the corner actuators generate a counterclockwise (as shown in FIG. 4) moment of identical magnitude on the mask ring 12, and at the same time, the mid-point actuators generate a clockwise (as shown in FIG. 4) moment at a magnitude of 42% of that of the counterclockwise moment generated by the corner actuators. The counterclockwise moment can be achieved by applying forces with equal magnitude from the lower (adjacent to the plane of the mask element 13), radially outer forcing elements as well as from the upper (distal to the plane of the mask element), radially inner forcing elements. The clockwise moment generated by each of the mid-point actuators can be achieved by applying forces with equal magnitude from the lower radially inner forcing elements and the upper radially outer forcing elements. In the area of the application of each moment, the downward forces generated from upper forcing elements are exactly balanced by the upward forces generated by the lower forcing elements. Thus, no or minimum reaction forces are generated from the X-ray stepper's mask holding mechanism to introduce unwanted distortion on the mask 10. To contract the mask pattern 20, each of the corner actuators generates a clockwise (as viewed in FIG. 4) moment of the identical magnitude on the mask ring 12, and at the same time, each of the mid-point actuators generates a counterclockwise moment at a magnitude of 42% of that of the clockwise moment generated by the corner actuators. The clockwise moment can be achieved by applying forces with equal magnitude from the radially outer upper forcing elements, as well as from the radially inner lower elements. The counterclockwise moment generated by the mid-point actuators can be achieved by applying forces with equal magnitude from the radially outer lower forcing elements, as well as from the radially inner upper facing elements. Again, the upward forces generated from the lower forcing elements are exactly balanced by the downward forces generated by the upper forcing elements. Thus, no or minimum reaction forces are generated from the X-ray stepper's mask holding mechanism to introduce more unwanted distortion on the mask 10.

Figure 7:
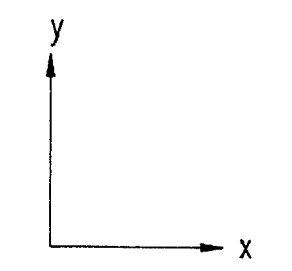
FIG. 7 is a finite element model, using vectors, to indicate the magnification of a mask pattern by employing a second actuator loading configuration according to the present invention.
Figure 7:
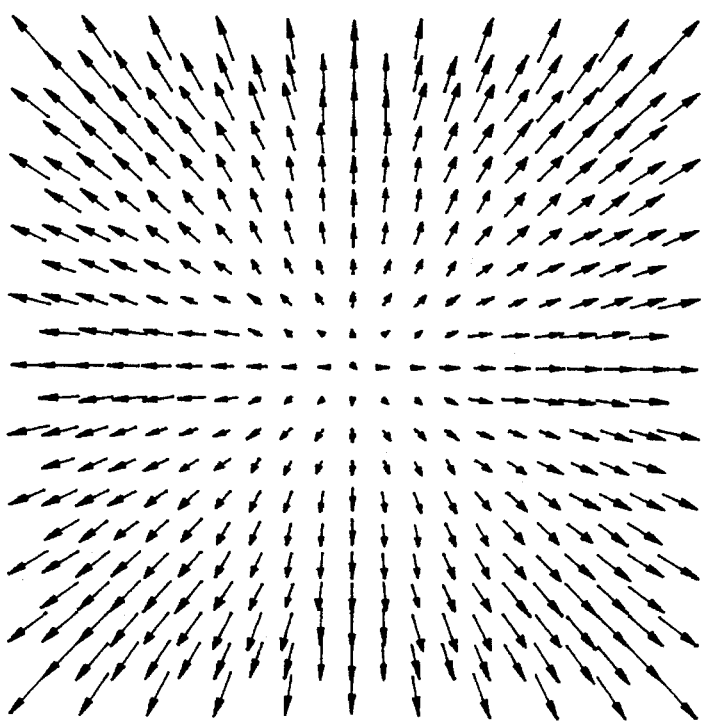
Figure 8:
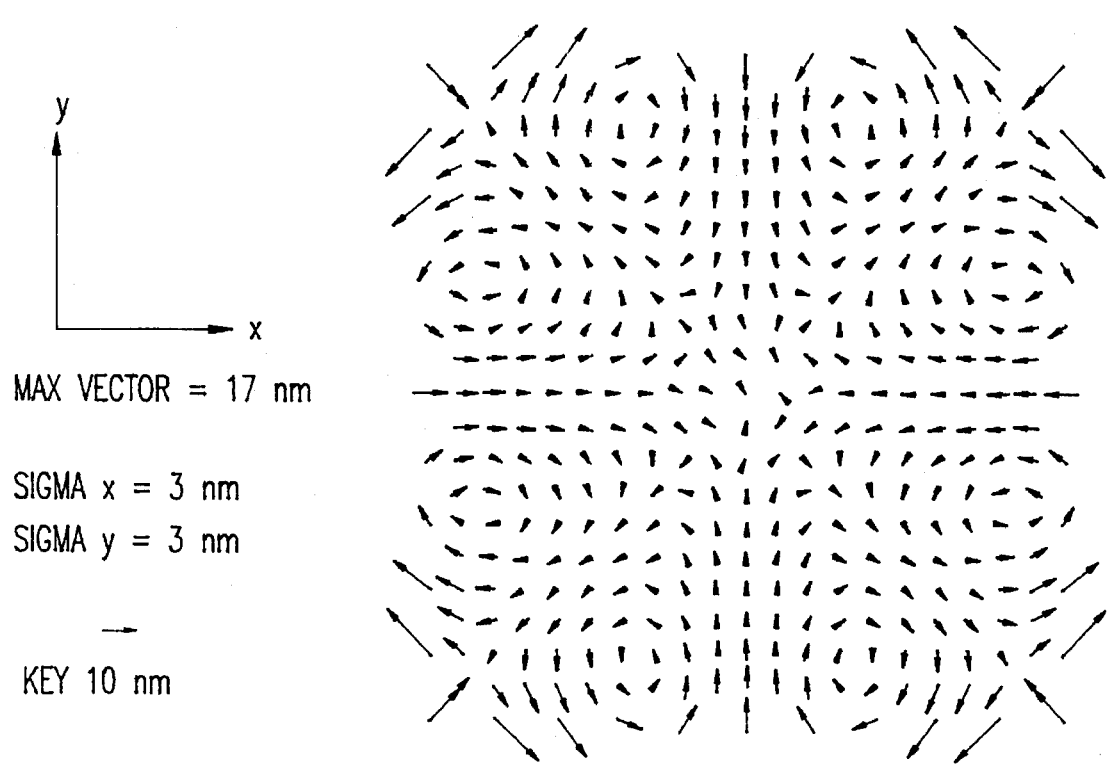
FIG. 8 is a finite element model, using vectors, of the residual error between the mask pattern as magnified in FIG. 7 and a mask pattern which would result in no overlay error.

The advantage of the second loading pattern is that smaller forces than those of the first-described loading pattern are needed to accomplish the same magnification adjustment. However, the disadvantage is that the residual error, the mathematical differences between the adjusted pattern dimension and the pattern dimension of a pure magnification adjustment, is slightly higher than that of the first loading pattern. Again, using the finite element analysis, the mask pattern adjustment and the pattern residual error (after removal of magnification adjustment) of the second loading pattern are shown in FIGS. 7 and 8, respectively. The key in FIG. 7 shows a vector having a magnitude of 100 nm, and in FIG. 8 a magnitude of 10 nm. As shown in FIG. 7, the mask pattern displacement, with similar magnitude of applied forces as in the first optimized loading pattern of FIG. 5, achieved a maximum displacement vector of 245 nm with one standard deviation in both the x-direction and the y-direction of 107 nm. As is shown in FIG. 8, the residual displacement, after removal of 7.3 ppm of pure magnification displacement, has a maximum displacement vector of 17 nm, with one standard deviation in both the x-direction and the y-direction of 3 nm.

The two optimized loading configurations described heretofore can be implemented independently or jointly with a mask mounting mechanism, which is part of a conventional X-ray stepper. If the stepper's design can only provide a limited magnitude of actuation forces on the forcing elements, the second optimized loading pattern can be used for large magnification mismatch between the mask and the wafer. Since masks with large magnification error may not require a very stringent overlay accuracy, larger magnification adjustment residual errors can be tolerated. The first optimized loading pattern can be used to correct for small magnification mismatch between the mask and the wafer which may require more demanding overlay accuracy.

Figure 9:
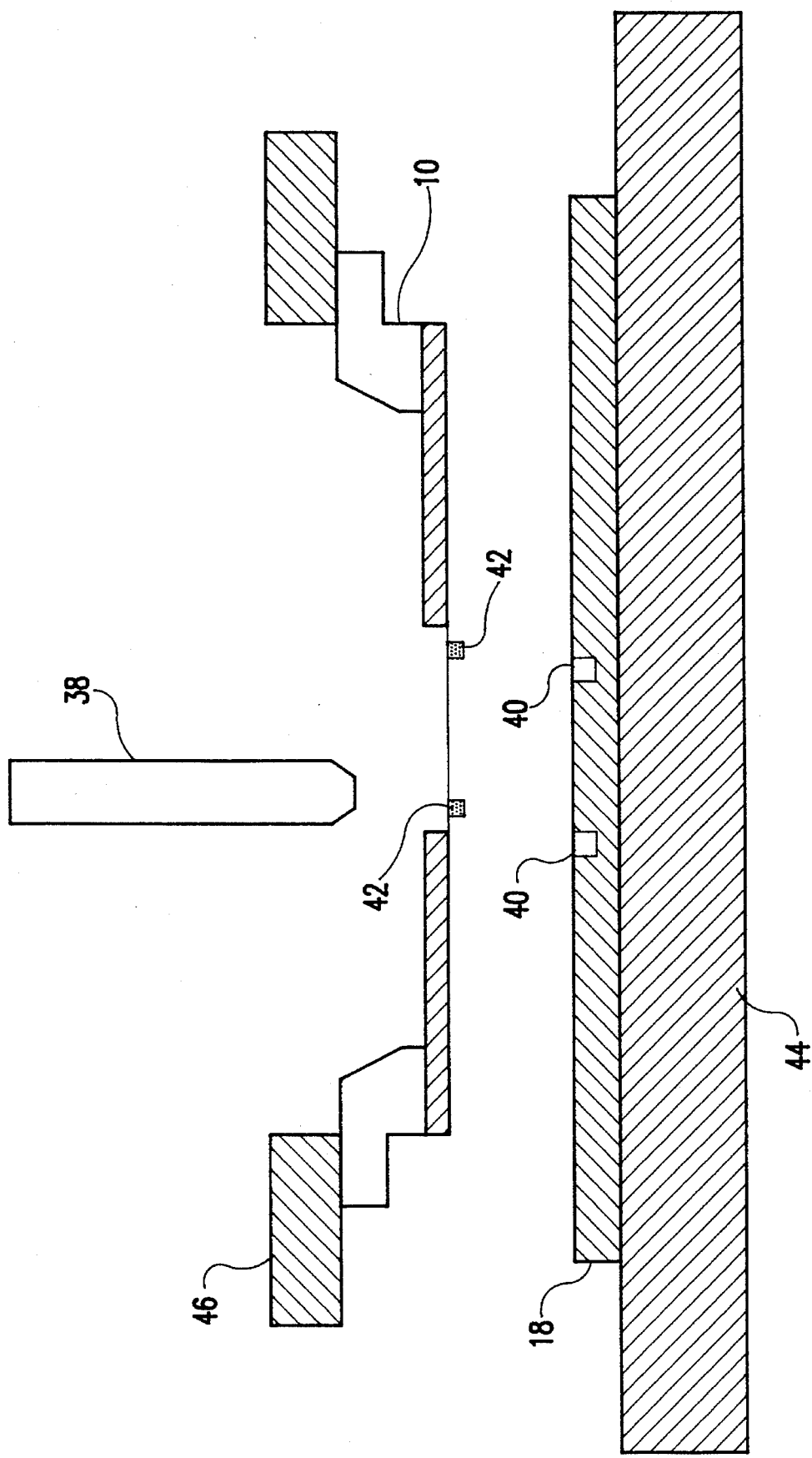
FIG. 9 is a sample X-ray stepper configuration.

Conventional X-ray steppers have one or more alignment systems 38 that detect the position of the wafer 18 relative to that of the mask 10 using sets of alignment marks 40 and 42 on the wafer 18 and the mask 10, respectively, as shown in FIG. 9. Any misplacement between the two sets of alignment marks is corrected by a wafer stage 44, which supports the wafer 18, and/or by the mask stage 46, which supports the mask 10. At least one of wafer stage 44 and the mask stage 46 is movable relative to the X-ray stepper. The alignment system 38 can be used to detect the relative linear displacement (in the X and Y directions) between the mask 10 and the wafer 18, as well as relative rotation and relative magnification. Once the magnification mismatch information is fed to a control computer, which is a conventional part of an X-ray stepper, the magnification adjustment mechanism according to the present invention then effects the necessary adjustment on the mask 10 to minimize the error. This can be done by applying the primary or reference force with the appropriate forcing elements, as described heretofore, and then applying the other forces, such as the 63% and 37% forces with other appropriate forcing elements. The alignment system 38 can re-measure the position between the mask 10 and the wafer 18, and adjust the forces applied to the mask 10, while keeping the same relative force percentages, until a certain minimum error criterion is achieved. The exact implementation of the above step depends on the design and configuration of the X-ray aligner's control system.

Figure 10:
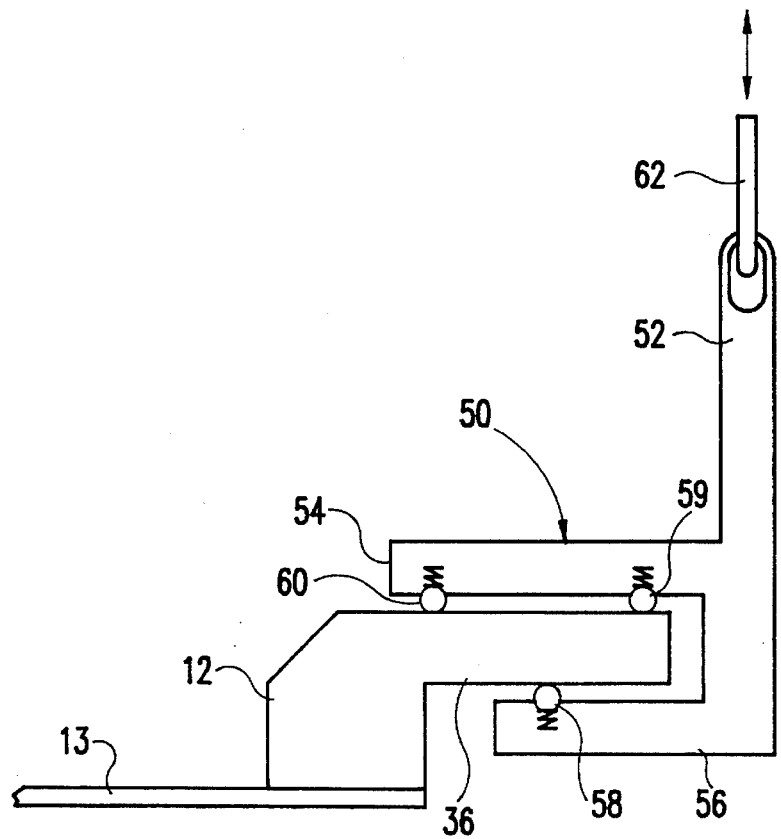
FIG. 10 is a schematic illustration of a 3-point clamp for use in connection with the present invention.

As an alternative to the 4-point actuator 24 or clamp illustrated in FIG. 4, a 3-point clamp 50, such as that illustrated in FIG. 10, can also be used with the second loading pattern. The 3-point clamps 50 apply forces to the mask ring 12 along the same axes and in the same areas as the 4-point actuators 24. Each 3-point clamp 50 comprises a rod 52, two arms 54 and 56 projecting transversely from the rod, the arms being spaced from and generally parallel to one another, and three contact points 58, 59 and 60 on the arms for engaging the mask ring 12. In the embodiment illustrated in FIG. 10, the mask ring 12 has a flange 36, and the arms 54 and 56 of the 3-point clamp 50 extend on opposite sides of the flange. The arm 54, which is adjacent to a face of the flange 36 distal to the mask element 13, has two of the contact points 59 and 60 spaced from one another in a radial direction with respect to the ring 12. The other arm 56 is adjacent to a side of the flange 36 adjacent to the mask element 13 and carries a single contact point 58 positioned radially between the two contact points 59 and 60 on the other arm 54. Each contact point 58, 59 and 60 comprises an element, such as a ball, spring-biased into contact with its adjacent face of the flange 36.

An end of the rod 52 is connected to an actuator 62 for applying a force to the flange 36 of the mask ring 12 through the contact elements 58, 59 and 60. The actuator 62 can be any of various known linear actuators, such as pneumatic actuators, which can both push and pull the rod 52 in a direction parallel to the longitudinal axis of the rod. When a pulling force is applied to the rod 52, that is, in a direction toward the end of the rod spaced from the arms 54 and 56, the contact point 60 acts as a pivot. A force acts on point 58, but no force acts on point 59. This pulling action on the 3-point clamps 50 stretches the membrane 14 and causes positive magnification.

When a pushing force is applied to the rod 52, that is, in a direction away from the end of the rod, the contact point 58 is the pivot. A force acts on point 59, but no force acts on point 60. Such a pushing force applied to the 3-point clamps 50 contracts the membrane 14 of the mask 10 and causes negative magnification.

Since there are numerous methods of implementing a net zero force loading mechanism along the periphery of the mask ring 12, the present invention contemplates any force actuating scheme that is configured along four axes, especially four axes separated by substantially 45 degrees.

The methods described thus far are well suited to isotropic magnification, where the magnification in two orthogonal directions, such as the horizontal and vertical directions as shown in FIG. 3, is equal. However, where anisotropic magnification is called for, the previously-described methods are modified to provide greater magnification in the horizontal direction than in the vertical direction, or vice versa. Anisotropic magnification of the circuit pattern 14 on the mask 10 can be required where previously-formed patterns on the wafer 18 exhibit greater magnification in one direction than the other. Such patterns on the wafer 18 require anisotropic magnification of a subsequent circuit pattern 20 on the mask 10 in order to minimize overlay error. Anisotropic magnification of the circuit pattern 20 on the mask 10 can also be required if the mask is tilted slightly relative to the wafer 18.

In order to provide greater magnification in the vertical direction than in the horizontal direction in FIG. 3, for example, greater torque can be applied to the mask ring 12 along the vertical bisecting axis 28 than along the horizontal bisecting axis 29. As a result, there will be greater stretching of the membrane 14 in the vertical direction and, thus, greater magnification of the circuit pattern 20 in the vertical direction than in the horizontal direction. In addition, for greater magnification in the vertical direction, the corner axes 26 and 27 are changed slightly. These axes still pass through the radially inner locations 26b, 26c, 27b and 27c. However, the radially outer locations 26a, 26d, 27a and 27d are all shifted slightly around the circumference of the mask ring 12 toward the bisecting axis 29 to points 26a', 26d', 27a' and 27d'. As a result, torque applied to the mask ring 12 in these areas will lie in planes normal to the plane defined by the mask element 13 and passing through, respectively, the points 26a' and 26b, 26d' and 26c, 27a' and 27b, and 27d' and 27c. The planes in which torque is produced define angles θ with the vertical bisecting axis 28. These angles θ are greater than the angles between the corner axes 26, 27 and the vertical bisecting axis 28. Where a single actuator contains four forcing elements, such as the actuator 24, each actuator lying along a corner axis 26 and 27 will be pivoted slightly around its radially inner forcing elements at one of the radially inner locations 26b, 26c, 27b, and 27c so that the radially outer forcing elements are closer to the horizontal bisecting axis 29 than they are for isotropic magnification.

It is expected that the shifting of the corner axes 26 and 27 from isotropic conditions will be very small. It can be appreciated that magnification can be made greater in the horizontal direction than in the vertical direction in FIG. 3 by applying greater torque along the bisecting axis 29 than along the bisecting axis 28, and by shifting the radially outer locations 26a, 26d, 27a, and 27d at which forcing elements apply force along the corner axes 26 and 27 slightly around the circumference of the mask ring 12 toward the vertical bisecting axis 28.

The modified method also provides better results for membranes having the shape of rectangles in which two sides are longer than the other two sides. Proportionally greater stretching of the membrane in the direction of the longer sides than in the direction of the shorter sides is needed to make the magnification of a circuit pattern on the membrane isotropic. To do this, the ratio of the sum of the torques causing stretching parallel to the longer sides to the sum of the torques causing stretching parallel to the shorter sides is substantially equal to the aspect ratio of the membrane, that is, the ratio of the length to the width of the rectangular membrane. In combination with the proper ratio of the sums of the torques, the radially outer locations 26a, 26d, 27a and 27d are shifted the proper amount around the circumference of the mask ring 12 toward the bisecting axis which is parallel to the shorter sides. The magnification correction of the circuit patterns of such non-square rectangular membranes can be made anisotropic by applying forces which stretch the membrane in a ratio different from the aspect ratio of the membrane.

It will be apparent to those skilled in the art and it is contemplated that variations and/or changes in the embodiments illustrated and described herein may be made without departure from the present invention. Accordingly, it is intended that the foregoing description is illustrative only, not limiting, and that the true spirit and scope of the present invention will be determined by the appended claims.

I claim:

1. Apparatus for magnification correction in 1-X proximity X-ray lithography involving an X-ray mask having a ring, a mask element secured to the ring, a rectangular membrane formed in the mask element, and a design pattern defined on the membrane, the membrane having corners, comprising:

mechanical devices arranged in a plurality of areas on the ring, some of the areas lying on corner axes intersecting one another and extending diagonally through the corners of the membrane, and the other areas lying on axes which bisect angles formed by the intersection of the corner axes, said mechanical devices comprising means for producing torque in the ring and thereby stretching and shrinking the membrane and the design pattern.

2. The apparatus of claim 1, wherein said torque producing means comprises means for applying loads to the ring in directions perpendicular to the plane of the mask element.

3. The apparatus of claim 1, wherein said mechanical devices comprise means for producing the torque about torque axes and in planes normal to the plane of the mask element.

4. The apparatus of claim 3, wherein said mask element lies in a plane, said torque axes are spaced from the plane of the mask element, and said mask element is held under tension on said ring, whereby the torque producing means stretches the membrane and the design pattern when the torque is produced in one direction and shrinks the membrane and the design pattern when the torque is produced in the opposite direction.

5. The apparatus of claim 4, wherein a flange projects radially outward from said ring, and said torque producing means comprises means for applying loads to said flange in directions perpendicular to the plane of the mask element.

6. The apparatus of claim 5, wherein said flange has first and second opposite sides, and said mechanical devices comprise forcing elements engaging said first and second opposite sides of said flange.

7. The apparatus of claim 6, wherein each said mechanical device comprises four of said forcing elements, wherein two of said four forcing elements engage said first side of said flange and two of said four forcing elements engage said second opposite side of said flange, one of each said two forcing elements engaging its side of the flange inside the torque axis with respect to the radius of the ring and the other engaging its side of the flange outside the torque axis with respect to the radius of the ring.

8. The apparatus of claim 4, wherein said mechanical devices comprise forcing elements engaging said first and second opposite axial sides of said ring.

9. The apparatus of claim 8, wherein each said mechanical device comprises four of said forcing elements, wherein two of said four forcing elements engage said first axial side of said ring and two of said four forcing elements engage said second axial side of said ring, one of each said two forcing elements being an inner forcing element engaging its axial side of said ring inside the torque axis with respect to the radius of the ring and the other being an outer forcing element engaging its axial side of said ring outside the torque axis with respect to the radius of the ring.

10. The apparatus of claim 9, wherein an outer forcing element of each mechanical device in an area lying on a corner axis applies to the ring a primary load in a first direction, the primary loads being equal to one another, an outer forcing element of each mechanical device in an area lying on a bisecting axis applies to the ring in a second direction opposite to the first direction a load having a magnitude of a first predetermined amount which is less than of the primary load and dependent on the size of the membrane in relationship to the size of the ring, and an inner forcing element of each mechanical device in an area lying on a corner axis applies to the ring in said second direction a load having a magnitude of a second predetermined amount which is less than the primary load and dependent on the size of the membrane in relationship to the size of the ring, the sum of all of the loads being near or substantially zero.

11. The apparatus of claim 1, wherein two of said mechanical devices are arranged on each of said axes, one of the two mechanical devices being arranged on one side of the center of the ring and the other of the two mechanical devices being arranged on the opposite side of the center of the ring.

12. The apparatus of claim 11, comprising at least two of said corner axes and at least two of said bisecting axes.

13. Apparatus for magnification correction in 1-X proximity X-ray lithography comprising:

an X-ray mask having a ring, a mask element secured to the ring, a rectangular membrane formed in the mask element, and a design pattern defined on the membrane, the membrane having corners; and means for producing torque in the ring by applying loads to the ring in directions perpendicular to the plane of the mask element in a plurality of areas on the ring, some of the areas lying on corner axes intersecting one another and extending diagonally through the corners of the membrane, and the other areas lying on bisecting axes which bisect angles formed by the intersection of the corner axes.

14. A method for correcting magnification in 1-X proximity X-ray lithography involving an X-ray mask having a ring, a mask element secured to the ring, a rectangular membrane formed in the mask element, and a design pattern defined on the membrane, the membrane having corners, comprising:

producing torque in the ring in a plurality of areas on the ring lying on corner axes intersecting one another and extending diagonally through the corners of the membrane, and on bisecting axes which bisect the angles formed by the intersection of the corner axes.

15. The method of claim 14, further comprising producing the torque in the ring by applying loads to the ring in axial directions perpendicular to the plane of the mask element.

16. The method of claim 14, wherein the torque is produced about torque axes and in planes normal to the plane defined by the mask element.

17. The method of claim 16, wherein the ring has first and second opposite axial sides, the torque axes are spaced from the plane of the mask element, and the mask element is held under tension on said ring, and the torque is produced in one direction to stretch the membrane and the design pattern, and in the opposite direction to shrink the membrane and the design pattern.

18. The method of claim 17, wherein a flange projects radially outward from said ring, and the torque is produced by applying loads to said flange in directions perpendicular to the plane of the mask element.

19. The method of claim 15, wherein the loads are applied in two areas on each of said axes, one of the areas of each said axis being on one side of the center of the ring and the other of the areas being on the opposite side of the center of the ring.

20. The method of claim 14, wherein the step of producing torque in the ring comprises producing a substantially zero net force on the ring.

21. The method of claim 19, wherein, in each said area, loads are applied at inner and outer points with respect to the radius of the ring, a primary load is applied at an outer point in a first direction in each area of the ring lying on a corner axis, the primary loads being equal to one another, a load having a magnitude of a first predetermined amount which is less than the primary load and dependent on the size of the membrane in relationship to the size of the ring is applied at an outer point in a second direction opposite to the first direction in each area of the ring lying on a bisecting axis, and a load having a magnitude of a second predetermined amount which is less than the primary load and dependent on the size of the membrane in relationship to the size of the ring is applied at an inner point in the second direction in each area of the ring lying on a corner axis.

22. The method of claim 19, wherein the torque is produced in two areas on each of said axes, one of the areas on each said axis being on one side of the center of the ring and the other of said areas being on the opposite side of the center of the ring, a first torque is applied in a first direction relative to the ring in each area of the ring lying on a corner axis, the first torques being equal to one another in magnitude, a second torque having a magnitude of a predetermined amount which is less than the first torque and dependent on the size of the membrane in relationship to the size of the ring is applied in a second direction relative to the ring opposite to the first direction in each area of the ring lying on a bisecting axis.

23. A method for correcting magnification in 1-X proximity X-ray lithography involving an X-ray mask having a ring, a mask element secured to the ring, a rectangular membrane formed in the mask element, and a design pattern defined on the membrane, the membrane having corners, comprising:

producing torque in the ring in a plurality of areas on the ring lying generally on corner axes intersecting one another and extending diagonally through the corners of the membrane, and on a first bisecting axis and a second bisecting axis, the bisecting axes bisecting the angles formed by the intersection of the corner axes, wherein greater torque is produced in the ring along the first bisecting axis than along the second bisecting axis, and the torque in the areas of the ring lying generally on corner axes is produced in planes defining first angles with the first bisecting axis, said first angles being greater than the angles between the corner axes and the first bisecting axis, whereby greater magnification is produced parallel to the first bisecting axis than parallel to the second bisecting axis.

24. The method of claim 23, wherein the magnification correction is anisotropic.

25. The method of claim 23, wherein the rectangular membrane has four sides, two of the sides being longer than the other two sides, and the magnification correction is made isotropic by producing torque causing stretching of the membrane in the direction of the longer sides and torque causing stretching of the membrane in the direction of the other sides in a ratio substantially equal to the ratio of the length of the longer sides to the length of the other sides.

* * * * *